US009447932B2

(12) United States Patent
An et al.

(10) Patent No.: US 9,447,932 B2
(45) Date of Patent: Sep. 20, 2016

(54) LIGHT-EMITTING DIODE PACKAGE AND METHOD OF MANUFACTURING THE SAME

(71) Applicant: Samsung Display Co., Ltd., Yongin, Gyeonggi-Do (KR)

(72) Inventors: Jae Sul An, Hwaseong-si (KR); Seok Hyun Nam, Seoul (KR); Sang Hyuck Yoon, Seoul (KR); Yeong Bae Lee, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/306,127

(22) Filed: Jun. 16, 2014

(65) Prior Publication Data

US 2015/0219288 A1 Aug. 6, 2015

(30) Foreign Application Priority Data

Feb. 5, 2014 (KR) ........................ 10-2014-0013127

(51) Int. Cl.
| | | |
|---|---|---|
| *H01L 33/00* | (2010.01) | |
| *F21K 99/00* | (2016.01) | |
| *H01L 33/44* | (2010.01) | |
| *H01L 33/50* | (2010.01) | |
| *H01L 33/64* | (2010.01) | |

(52) U.S. Cl.
CPC . *F21K 9/56* (2013.01); *F21K 9/90* (2013.01); *H01L 33/44* (2013.01); *H01L 33/507* (2013.01); *H01L 33/502* (2013.01); *H01L 33/644* (2013.01)

(58) Field of Classification Search
CPC ....... H01L 33/22; H01L 33/28; H01L 33/42; H01L 33/46; H01L 33/483; H01L 33/50; H01L 33/501; H01L 33/505; H01L 33/56; H01L 33/44; H01L 33/507; H01L 33/502; H01L 33/644; F21K 9/56; F21K 9/90
USPC .......................................................... 257/98
See application file for complete search history.

(56) References Cited

U.S. PATENT DOCUMENTS

| | | | | |
|---|---|---|---|---|
| 6,890,642 | B2 * | 5/2005 | Kaminsky et al. | ......... 428/319.3 |
| 7,819,539 | B2 * | 10/2010 | Kim | ...................... H01L 33/507 313/110 |
| 8,169,135 | B2 * | 5/2012 | Zhai et al. | .................... 313/501 |
| 8,575,642 | B1 * | 11/2013 | Shum | ...................... H01L 33/44 257/98 |
| 2007/0217204 | A1 * | 9/2007 | Hough et al. | ................. 362/299 |
| 2010/0155749 | A1 | 6/2010 | Chen et al. | |
| 2011/0182056 | A1 | 7/2011 | Trottier et al. | |
| 2011/0186887 | A1 | 8/2011 | Trottier et al. | |

(Continued)

FOREIGN PATENT DOCUMENTS

| | | |
|---|---|---|
| JP | 2011-198930 A | 10/2011 |
| KR | 10-2011-0069611 A | 6/2011 |

(Continued)

*Primary Examiner* — Tod T Van Roy
*Assistant Examiner* — Vu A Vu
(74) *Attorney, Agent, or Firm* — Innovation Counsel LLP

(57) ABSTRACT

A light-emitting diode (LED) package and a method of manufacturing the same are provided. The LED package includes a package mold, an LED chip located on a surface of the package mold, and a wavelength converter located on the surface of the package mold and separated from the LED chip. The wavelength converter includes a first barrier layer located on the surface of the package mold, a wavelength conversion layer located on the first barrier layer, and a second barrier layer located on the wavelength conversion layer.

19 Claims, 19 Drawing Sheets

(56) References Cited

U.S. PATENT DOCUMENTS

| | | |
|---|---|---|
| 2011/0215348 A1 | 9/2011 | Trottier et al. |
| 2011/0303940 A1* | 12/2011 | Lee et al. .................. 257/98 |
| 2012/0154464 A1 | 6/2012 | Ninan et al. |
| 2012/0163013 A1 | 6/2012 | Buelow, II et al. |
| 2012/0262941 A1* | 10/2012 | Min ......................... 362/607 |
| 2012/0274882 A1 | 11/2012 | Jung |
| 2013/0175558 A1* | 7/2013 | Orsley et al. .............. 257/88 |
| 2013/0207072 A1 | 8/2013 | Chang et al. |
| 2013/0270587 A1* | 10/2013 | Ouderkirk et al. ......... 257/89 |

FOREIGN PATENT DOCUMENTS

| | | |
|---|---|---|
| KR | 10-2011-0136676 A | 12/2011 |
| KR | 10-2012-0050286 A | 5/2012 |
| KR | 10-2012-0059061 A | 6/2012 |
| KR | 10-2013-0043294 A | 4/2013 |
| KR | 10-1266130 A | 5/2013 |
| KR | 10-1270968 B1 | 6/2013 |
| KR | 10-1281130 B1 | 7/2013 |

\* cited by examiner

LIGHT-EMITTING DIODE PACKAGE AND METHOD OF MANUFACTURING THE SAME

This application claims priority from Korean Patent Application No. 10-2014-0013127 filed Feb. 5, 2014 in the Korean Intellectual Property Office, the disclosure of which is incorporated herein by reference in its entirety.

BACKGROUND

1. Technical Field

The present disclosure relates to a light-emitting diode (LED) package and a method of manufacturing the same.

2. Description of the Related Art

Liquid crystal displays (LCDs) are one of the most widely used types of flat panel displays (FPDs). Generally, an LCD includes two substrates having electrodes and a liquid crystal layer interposed between the substrates. In an LCD, voltages are applied to electrodes to rearrange liquid crystal molecules of a liquid crystal layer, thereby controlling the amount of light that passes through the liquid crystal layer.

An LCD is a passive light-emitting device and requires a backlight assembly for providing light to pass through the liquid crystal layer. Examples of a light source used in the backlight assembly may include a cold cathode fluorescent lamp (CCFL), an external electrode fluorescent lamp (EEFL), or a light-emitting diode (LED). Currently, backlight assemblies using high-luminance LEDs are being extensively utilized.

An LED may be provided in the form of an LED package. An LED package generally includes a package mold, an LED chip disposed on the package mold and capable of emitting blue light, a phosphor located on the LED chip and capable of converting blue light emitted from the LED chip into white light. In some instances, the LED package may further include a lens covering the LED chip and the phosphor.

The phosphor may have limitations in generating high-purity white light. Therefore, quantum dots may be used instead of phosphor to generate high-purity white light.

However, the LED chip generates a lot of heat, and quantum dots are generally very sensitive to heat. Therefore, the LED chip and the quantum dots in the LED package should be separated from each other in order to produce light in a stable manner. In this case, however, the thickness of the LED package is increased, which in turn leads to an increase in the thickness of the LCD.

To separate the LED chip and the quantum dots, an optical part including quantum dots may be manufactured and placed separate from the LED package. However, the above method increases the total manufacturing costs and time of the LCD.

SUMMARY

The present disclosure addresses at least the above packaging issues relating to existing LED packages including quantum dots.

According to some embodiments of the inventive concept, a light-emitting diode (LED) package is provided. The LED package includes a package mold, an LED chip located on a surface of the package mold, and a wavelength converter located on the surface of the package mold and separated from the LED chip. The wavelength converter includes a first barrier layer located on the surface of the package mold, a wavelength conversion layer located on the first barrier layer, and a second barrier layer located on the wavelength conversion layer.

In some embodiments, the wavelength conversion layer may include quantum dots.

In some embodiments, the LED chip and the wavelength converter may lie in a same plane.

In some embodiments, the LED package may further include a cover located on the surface of the package mold and covering the LED chip and the wavelength converter, wherein the cover may include a transparent base member and an optical coating layer that reflects most of light in a specific wavelength region.

In some embodiments, the optical coating layer may pass most of light in a wavelength region excluding the specific wavelength region.

In some embodiments, the specific wavelength region may be a wavelength region of blue light.

In some embodiments, the optical coating layer may include a plurality of optical patterns separated from each other.

In some embodiments, at least one of the first barrier layer and the second barrier layer may include an insulating material.

In some embodiments, the insulating material may include at least one of silicon oxide and silicon nitride.

In some embodiments, the LED chip may emit blue light, and the wavelength converter may convert the blue light into yellow light.

In some embodiments, the LED chip and the wavelength converter may be separated by a distance of less than approximately 30 mm.

In some embodiments, an area of the wavelength conversion layer may be approximately 10 to 200 times an area of the LED chip.

In some embodiments, at least one of the first barrier layer and the second barrier layer may cover the LED chip.

In some embodiments, the LED package may farther include a heat-blocking member interposed between the LED chip and the wavelength converter, wherein the heat-blocking member may prevent heat generated from the LED chip from being transferred to the wavelength converter.

According to some other embodiments of the inventive concept, an LED package is provided. The LED package includes a package mold, an LED chip located on a surface of the package mold, a wavelength converter located on the surface of the package mold and separated from the LED chip, and a cover located on the surface of the package mold and covering the LED chip and the wavelength converter. The cover includes a transparent base member, and an optical coating layer located on the transparent base member, wherein the optical coating layer reflects most of light in a specific wavelength region.

In some embodiments, the wavelength converter may include a first barrier layer located on the surface of the package mold, a wavelength conversion layer located on the first barrier layer, and a second barrier layer located on the wavelength conversion layer.

In some embodiments, the wavelength conversion layer may include quantum dots.

According to some further embodiments of the inventive concept, a method of manufacturing an LED package is provided. The method includes forming an LED chip on a surface of a package mold, and forming a wavelength converter on the surface of the package mold, wherein the wavelength converter is separated from the LED chip, wherein forming the wavelength converter includes forming a first barrier layer on the surface of the package mold, forming a wavelength conversion layer on the first barrier layer, and forming a second barrier layer on the wavelength conversion layer.

In some embodiments, the method of manufacturing the LED package may further include forming a cover on the surface of the package mold after forming the wavelength converter, the cover covering the LED chip and the wavelength converter.

In some embodiments, forming the cover may include preparing a transparent base member, and forming an optical coating layer on the transparent base member, wherein the optical coating layer may reflect most of light in a specific wavelength region.

BRIEF DESCRIPTION OF THE DRAWINGS

The above and other aspects and features of the inventive concept will be more apparent when exemplary embodiments of the inventive concept are described in detail with reference to the attached drawings.

DETAILED DESCRIPTION

The various aspects and features of the inventive concept and methods for achieving the various aspects and features will be apparent when the following embodiments are described in detail with reference to the accompanying drawings. However, it should be noted that the inventive concept is not merely limited to the embodiments disclosed herein, but that the inventive concept can be modified and implemented in diverse ways. The matters defined in the description, such as the detailed construction and elements, provide details to assist those of ordinary skill in the art to have a more comprehensive understanding of the inventive concept.

It will be understood that when an element or layer is referred to as being "on", "connected to" or "coupled to" another element or layer, it can be directly on, connected or coupled to the other element or layer, or with one or more intervening elements or layers being present. In contrast, when an element is referred to as being "directly on," "directly connected to" or "directly coupled to" another element or layer, there are no intervening elements or layers present. Like numbers refer to like elements throughout.

Although the terms "first," "second," and so forth are used to describe different constituent elements, the constituent elements are not limited by those terms. Rather, those terms are used to distinguish one constituent element from another other constituent element. Accordingly, a first constituent element may be described as a second constituent element in a different embodiment.

The light-emitting diode (LED) package in the present disclosure may be included in a display device. The display device may include a liquid crystal display (LCD), an electrophoretic display, an organic light-emitting display, an inorganic electroluminescent (EL) display, a field emission display, a surface-conduction electron-emitter display, a plasma display, or a cathode ray display. The inventive concept will be described with reference to an LCD including an LED package. However, it should be noted that the inventive concept is not limited to an LCD, and that the LED package can be included in various types of display devices, such as the ones described above.

Hereinafter, embodiments of the inventive concept will be described with reference to the attached drawings.

Figure 1:
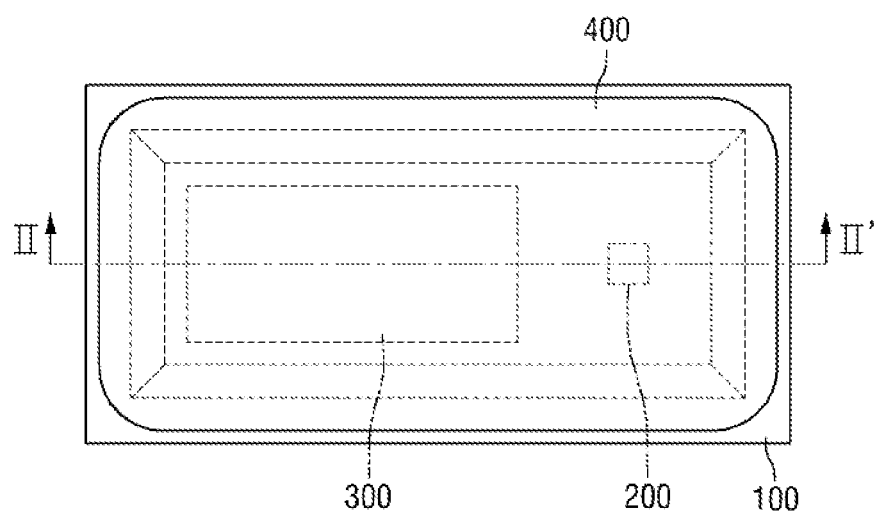
FIG. 1 is a plan view of a light-emitting diode (LED) package according to an embodiment of the inventive concept.
Figure 2:
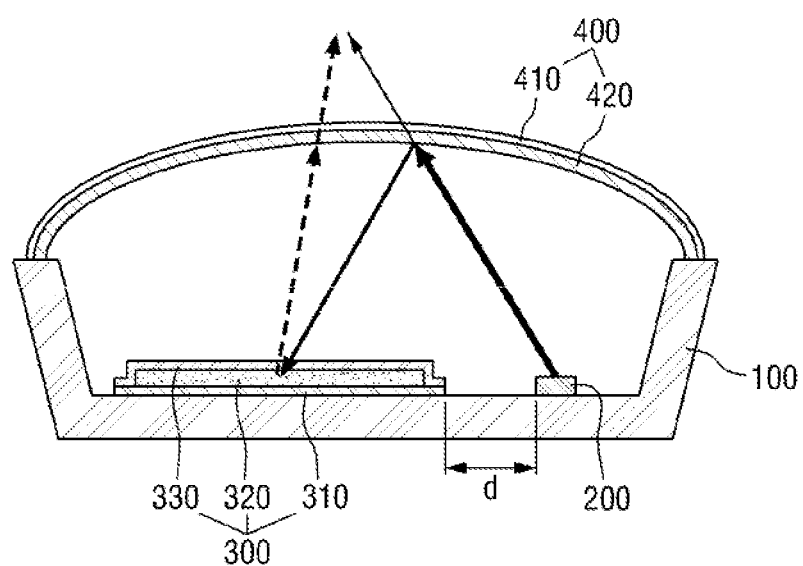
FIG. 2 is a cross-sectional view taken along line II-II' of FIG. 1.

FIG. 1 is a plan view of an LED package according to an embodiment of the inventive concept. FIG. 2 is a cross-sectional view taken along line II-II' of FIG. 1. Referring to FIGS. 1 and 2, the LED package includes a package mold 100, an LED chip 200, and a wavelength converter 300. In some embodiments, the LED package may further include a cover 400.

The package mold 100 may be located under the LED chip 200, the wavelength converter 300, and the cover 400. The package mold 100 may support the LED chip 200, the wavelength converter 300, and the cover 400.

The package mold 100 may include a bottom portion and sidewall portions protruding from the edges of the bottom portion. An inner surface of the bottom portion and an inner surface of each of the sidewall portions may form (but is not limited to) an obtuse angle. In addition, an outer surface of the bottom portion and an outer surface of each of the sidewall portions may form (but is not limited to) an obtuse angle. The bottom portion and the sidewall portions may form a space for housing the LED chip 200 and the wavelength converter 300.

The package mold 100 may be made of a polymer material. In an exemplary embodiment, the package mold 100 may include at least one of polycarbonate, polymethylmethacrylate, and polycyclohexylenedimethylene terephthalate. In another exemplary embodiment, the package mold 100 may include an organic material having excellent light resistance (such as silicon resin, epoxy resin, acrylic resin, fluoride resin or imide resin), or an inorganic material having excellent light resistance (such as glass or silica gel). In another exemplary embodiment, the package mold 100 may include a heat-resistant resin that is not melted by heat generated in a manufacturing process. In this case, to alleviate the thermal stress of the resin, the package mold 100 may include various additives including aluminum nitride, aluminum oxide, or a mixture of the same.

Although not illustrated in the drawings, the package mold 100 may include two lead frames which deliver external power to the LED chip 200. The two lead frames are connected to an external power source. One of the two lead frames is connected to an N-type electrode of the LED chip 200, and the other one of the two lead frames is connected to a P-type electrode of the LED chip 200. In addition, an inner surface of the package mold 100 (e.g., the inner surfaces of the bottom portion and the sidewall portions) may be coated with a reflective material. Accordingly, light emitted from the LED chip 200 may be reflected to the outside by the inner surface of the package mold 100.

The LED chip 200 may be located on a surface of the package mold 100. In addition, the LED chip 200 may be located in the space surrounded by the bottom portion and the sidewall portions of the package mold 100. In an exemplary embodiment, the LED chip 200 may be located on a side of the inner surface of the bottom portion of the package mold 100.

The LED chip 200 may emit light when supplied with external power. In an exemplary embodiment, the LED chip 200 may emit blue light, but the inventive concept is not limited thereto.

Although not illustrated in the drawings, the LED chip 200 may include a substrate, an N-type semiconductor layer, a P-type semiconductor layer, an active layer, an N-type electrode, and a P-type electrode. The substrate may be a sapphire substrate. The N-type semiconductor layer and the P-type semiconductor layer may be made of a nitride semiconductor such as GaN, AlGaN, InGaN, AlN, AlInGaN, etc. The active layer may emit light, and may be formed between the N-type semiconductor layer and the P-type semiconductor layer. The active layer may have a multi-quantum-well (MQW) structure including an InGaN layer as a well and a GaN layer as a barrier layer. The N-type electrode may be connected to the N-type semiconductor layer, and the P-type electrode may be connected to the P-type semiconductor layer. It should be noted that the above-described structure of the LED chip 200 can be modified in different ways.

The wavelength converter 300 may be located on the surface of the package mold 100. In some embodiments, the wavelength converter 300 may be located in the space surrounded by the bottom portion and the sidewall portions of the package mold 100. The wavelength converter 300 may be separated from the LED chip 200. In an exemplary embodiment, the wavelength converter 300 may be located on a side that is opposite to the inner surface of the bottom portion of the package mold 100 on which the LED chip 200 is located (that is, on the other side of the inner surface of the bottom portion of the package mold 100).

The wavelength converter 300 may convert the wavelength of light emitted from the LED chip 200. In an exemplary embodiment, the wavelength converter 300 may convert blue light emitted from the LED chip 200 into yellow light, but the inventive concept is not limited thereto.

Referring to FIG. 2, the wavelength converter 300 may include a first barrier layer 310, a wavelength conversion layer 320, and a second barrier layer 330.

The first barrier layer 310 may be located on a surface of the package mold 100. That is, the first barrier layer 310 may directly contact an inner surface of the bottom portion of the package mold 100. In addition, the first barrier layer 310 may be disposed under the wavelength conversion layer 320.

The first barrier layer 310 may be made of a material that can protect the wavelength conversion layer 320 from physical impact as well as external moisture and oxygen. In addition, the first barrier layer 310 may include a material that can prevent introduction of impurities from the package mold 100. In an exemplary embodiment, the first barrier layer 310 may include an insulating material such as silicon oxide (SiOx), silicon nitride (SiNx), or a combination of the same. For example, the first barrier layer 310 may be made of, but is not limited to, silicon dioxide ($SiO_2$).

The water vapor transmission rate (WVTR) and oxygen transmission rate (OTR) of the first barrier layer 310 may range from approximately $10^{-4}$ g/m$^2$/day to $10^{-2}$ g/m$^2$/day. Preferably, the WVTR and OTR of the first barrier layer 310 may be approximately $10^{-3}$ g/m$^2$/day. The first barrier layer 310 having a low WVTR and OTR can protect the wavelength conversion layer 320 from moisture and oxygen.

The optical absorbance of the first barrier layer 310 may be approximately 15% or less. Preferably, the optical absorbance of the first barrier layer 310 may be approximately 7% or less. The first barrier layer 310 having a low optical absorbance can minimize loss of light that is emitted from the LED chip 200 in the first barrier layer 310.

The wavelength conversion layer 320 may be located on the first barrier layer 310. In an exemplary embodiment, the wavelength conversion layer 320 may overlap a central portion of the first barrier layer 310. In another exemplary embodiment, the wavelength conversion layer 320 does not overlap the edge portions of the first barrier layer 310.

The wavelength conversion layer 320 may convert the wavelength of light emitted from the LED chip 200. In an exemplary embodiment, when the LED chip 200 emits blue light, the wavelength conversion layer 320 may convert the blue light into yellow light.

The wavelength conversion layer 320 may include quantum dots and a dispersing medium.

The quantum dots are semiconductor nanoparticles having a core-shell structure and range from several to tens of nanometers in size. The quantum dots emit different color light according to their particle size due to the quantum confinement effect. More specifically, the quantum dots generate light in a narrow wavelength band, and light emission of the quantum dots occurs when unstable (excited) electrons fall from a conduction band to a valence band. The quantum dots tend to generate light having a shorter wavelength when their particle size is smaller, and generate light having a longer wavelength when their particle size is larger. Therefore, light of all desired visible wavelengths can be generated by controlling the size of the quantum dots.

Each of the quantum dots may include any one nanocrystal selected from a group comprising a Si nanocrystal, a group II-VI compound semiconductor nanocrystal, a group III-V compound semiconductor nanocrystal, a group IV-VI compound semiconductor nanocrystal, or a mixture of any of the above.

The group II-VI compound semiconductor nanocrystal may include one or more of the following: CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZuTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, or HgZnSTe.

The group III-V compound semiconductor nanocrystal may include one or more of the following: GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, or InAlPAs.

The group IV-VI compound semiconductor nanocrystal may be SbTe.

The wavelength conversion layer 320 may include one type of quantum dots. For example, the wavelength conversion layer 320 may include quantum dots that convert the wavelength of incident light into the wavelength of yellow light. However, the inventive concept is not limited thereto, and the wavelength conversion layer 320 may also include two or more types of quantum dots. For example, the wavelength conversion layer 320 may include red quantum dots that convert the wavelength of incident light into the wavelength of red light, and green quantum dots that convert the wavelength of the incident light into the wavelength of green light. Accordingly, in the above embodiment, light of a desired color can be obtained by adjusting a ratio of the red quantum dots and the green quantum dots.

The dispersing medium may be mixed with the quantum dots to disperse the quantum dots. That is, the quantum dots may be dispersed in the dispersing medium (for example, an organic solvent or polymer resin) so as to be uniformly dispersed therein. The dispersing medium may be any transparent medium that does not affect the wavelength conversion performance of the quantum dots, does not reflect light, and does not cause optical absorption. The organic solvent may include at least one of toluene, chloroform, and ethanol. The polymer resin may include at least one of epoxy, silicone, polystyrene, and acrylate.

The wavelength conversion layer 320 may include an ultraviolet (UV) initiator, a thermosetting additive, a crosslinker, a dispersing agent, or a combination of any of the above, in addition to the dispersing medium.

A wavelength conversion layer including less than 5 wt % of quantum dots may be unable to fully provide a wavelength conversion function. On the other hand, a wavelength conversion layer including more than 30 wt % of quantum dots may excessively convert the wavelength of incident light. Accordingly, the wavelength conversion layer 320 in the inventive concept may include approximately 5 to 30 wt % of quantum dots. In an exemplary embodiment, the wavelength conversion layer 320 includes approximately 10 wt % of quantum dots, but the inventive concept is not limited thereto.

If the area of the wavelength conversion layer 320 is less than 10 times the area of the LED chip 200, the wavelength conversion layer 320 cannot fully provide the wavelength conversion function. On the other hand, if the area of the wavelength conversion layer 320 is more than 200 times the area of the LED chip 200, the wavelength conversion layer 320 may excessively convert the wavelength of incident light. Accordingly, the area of the wavelength conversion layer 320 may be approximately 10 to 200 times the area of the LED chip 200. In an exemplary embodiment, the area of the wavelength conversion layer 320 may be, but is not limited to, 50 times the area of the LED chip 200. For example, in the exemplary embodiment of FIG. 1, if the area of the LED chip 200 is approximately 1×1 mm, the area of the wavelength conversion layer 320 may be approximately 5×10 mm.

The second barrier layer 330 may be located on the wavelength conversion layer 320. The second barrier layer 330 may directly contact the upper and side surfaces of the wavelength conversion layer 320. That is, the second barrier layer 330 may seal the wavelength conversion layer 320 together with the first barrier layer 310. Here, steps may be formed in the edge portions of the second barrier layer 330.

The second barrier layer 330 may be made of a material that can protect the wavelength conversion layer 320 from physical impact as well as external moisture and oxygen. In an exemplary embodiment, the second barrier layer 330 may include an insulating material such as silicon oxide (SiOx), silicon nitride (SiNx), or a combination of the same. For example, the second barrier layer 330 may be made of, but is not limited to, silicon dioxide ($SiO_2$). In another exemplary embodiment, the second barrier layer 330 may be made of the same material as the first barrier layer 310.

The WVTR and OTR of the second barrier layer 330 may range from approximately $10^{-4}$ g/m²/day to $10^{-2}$ g/m²/day. Preferably, the WVTR and OTR of the second barrier layer 330 may be approximately $10^{-3}$ g/m² day. In an exemplary embodiment, the WVTR of the second barrier layer 330 may be substantially equal to the WVTR of the first barrier layer 310. The second barrier layer 330 having a low WVTR and OTR can protect the wavelength conversion layer 320 from moisture and oxygen.

The optical absorbance of the second barrier layer 330 may be approximately 15% or less. Preferably, the optical absorbance of the second barrier layer 330 may be approximately 7% or less. In an exemplary embodiment, the optical absorbance of the second barrier layer 330 may be substantially equal to the optical absorbance of the first barrier layer 310. The second barrier layer 330 having a low optical absorbance can minimize a loss of light emitted from the LED chip 200 in the second barrier layer 330.

The LED chip 200 and the wavelength converter 300 may lie in the same plane. In an exemplary embodiment, the LED chip 200 and the wavelength converter 300 may be located on the flat inner surface of the bottom portion of the package mold 100 and separated from each other.

A distance d between the LED chip 200 and the wavelength converter 300 may be greater than 0 mm and less than 30 mm. In some preferred embodiments, the distance d between the LED chip 200 and the wavelength converter 300 may be approximately 30 mm. If the distance d between the LED chip 200 and the wavelength converter 300 is greater than 30 mm, light emitted from the LED chip 200 may not be properly delivered to the wavelength converter 300, and it may be difficult to obtain light of a desired color.

The cover 400 may be located on the surface of the package mold 100. The cover 400 may cover the LED chip 200 and the wavelength converter 300. In an exemplary embodiment, the edges of the cover 400 may directly contact the ends of the sidewall portions of the package mold 100. Accordingly, the package mold 100 and the cover 400 can protect the LED chip 200 and the wavelength converter 300 from the external environment.

The cover 400 may include a transparent base member 410 and an optical coating layer 420.

The transparent base member 410 may be a transparent and thin glass substrate or lens. The transparent base member 410 may bulge upward. The transparent base member 410 may focus light emitted from the LED chip 200 and output the focused light.

The optical coating layer 420 may be located on a surface of the transparent base member 410. In an exemplary embodiment, the optical coating layer 420 may be formed on an inner surface of the transparent base member 410 in order to be protected from the external environment. That is, the optical coating layer 420 may face the LED chip 200 and the wavelength converter 300. However, the inventive concept is not limited thereto, and the optical coating layer 420 may also be formed on an outer surface of the transparent base member 410.

Figure 3:
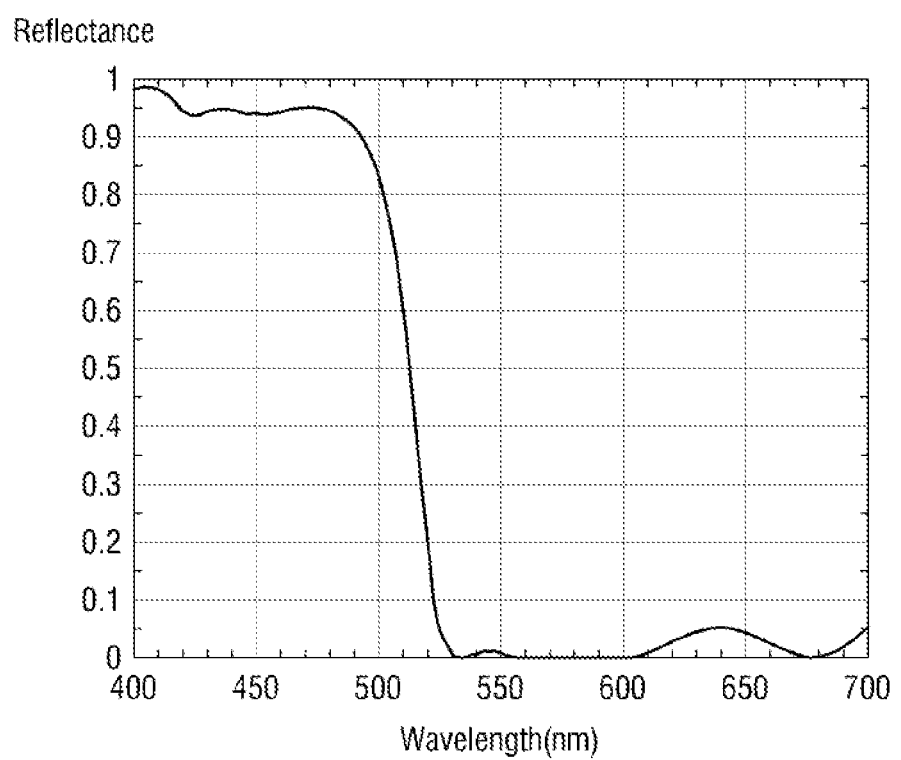
FIG. 3 is a graph illustrating the reflectance of the optical coating layer of FIG. 2 with respect to wavelength.

The optical coating layer 420 may reflect most of the light in a specific wavelength region. In addition, the optical coating layer 420 may pass most of the light in a wavelength region excluding the specific wavelength region, as described in greater detail with reference to FIG. 3. FIG. 3 is a graph illustrating the reflectance of the optical coating layer 420 with respect to wavelength.

Referring to FIG. 3, the optical coating layer 420 may reflect approximately 90% or more of light having a wavelength of approximately 400 to 500 nm. Here, the light having the wavelength of approximately 400 to 500 nm may be blue light, and the optical coating layer 420 may reflect most of the blue light. In addition, the optical coating layer 420 may pass approximately 90% or more of light having a wavelength of approximately 550 nm or more. Here, the light having the wavelength of approximately 550 nm may be yellow light and red light, and the optical coating layer 420 may pass most of the yellow light and the red light.

Referring back to FIGS. 1 and 2, the optical coating layer 420 may pass only a portion of blue light emitted from the LED 200 while reflecting most of the blue light. The blue light reflected by the optical coating layer 420 may enter the wavelength converter 300 and is converted into yellow light by the wavelength conversion layer 320 of the wavelength converter 300. Most of the yellow light may pass through the optical coating layer 420. Accordingly, the blue light and the yellow light emerging from the wavelength conversion layer 320 may be mixed to produce white light with high purity.

The optical coating layer 420 may be a dichroic coating layer. The optical coating layer 420 may be formed by alternately stacking different materials a number of times. In an exemplary embodiment, the optical coating layer 420 may have a multilayer structure comprising different metals and/or metal oxides. For example, the optical coating layer 420 may be formed by alternately stacking two or more materials (such as $TiO_2$, $Al_2O_3$, $ZrO_2$, $MgO$, or $SiO_2$) a number of times. In another exemplary embodiment, the optical coating layer 420 may have a distributed Bragg reflector (DBR) structure.

The optical coating layer 420 may be formed by stacking the above materials in approximately 20 to 100 layers. If the materials are stacked in less than 20 layers or more than 100 layers, the optical coating layer 420 may be unable to fully provide a wavelength-selective light reflection function. In an exemplary embodiment, the optical coating layer 420 may be formed by stacking the above materials in approximately 40 layers, but the inventive concept is not limited thereto.

The optical coating layer 420 having a thickness of less than 0.3 µm or more than 2 µm may be unable to fully provide the wavelength-selective light reflection function. Accordingly, the optical coating layer 420 may have a thickness of approximately 0.3 µm to 2 µm. In an exemplary embodiment, the thickness of the optical coating layer 420 may be, but is not limited to, approximately 0.8 µm.

As described above, since the LED package according to the current embodiment includes quantum dots, the LED package can generate high-purity light. The high-purity light directly contributes to the improvement of image resolution of a display device. In addition, since the LED chip 200 and the wavelength converter 300 including quantum dots are separated by a sufficient distance, the degradation of the quantum dots can be prevented. Further, since the quantum dots are sealed with the first barrier layer 310 and the second barrier layer 330, they can be protected from external moisture and oxygen. Also, since the LED chip 200 and the wavelength converter 300 lie in the same plane, a thin LED package can be manufactured, which in turn allows a slim display device or a display device having a narrow bezel to be manufactured.

Hereinafter, a method of manufacturing an LED package according to an embodiment of the inventive concept will be described with reference to FIGS. 4 through 9. FIGS. 4 through 9 are cross-sectional views of the LED package of FIG. 1 at different stages of manufacture according to an exemplary method of manufacturing the LED package. In the interest of clarity, elements substantially similar to those illustrated in the above-described drawings are indicated by like reference numerals, and thus a description of those similar elements will be omitted.

Figure 4:
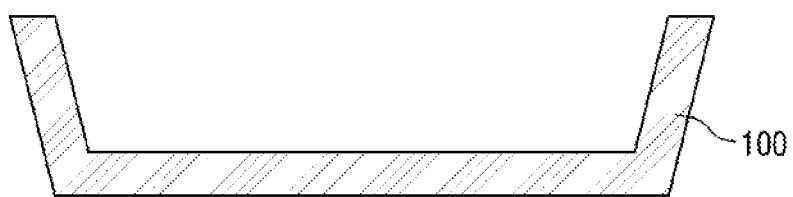
FIGS. 4 through 9 are cross-sectional views of the LED package of FIG. 1 at different stages of manufacture according to an exemplary method of manufacturing the LED package.

Referring to FIG. 4, a package mold 100 is prepared. The package mold 100 may be formed by, but is not limited to, an injection molding process.

Figure 5:
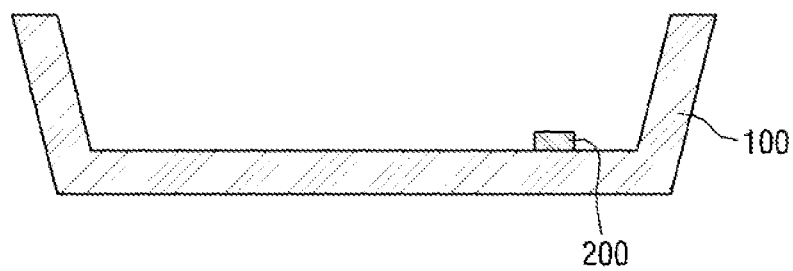

Referring to FIG. 5, an LED chip 200 is placed on a surface of the package mold 100. Although not illustrated in the drawing, the LED chip 200 may be electrically connected to two lead frames, as previously described.

Figure 6:
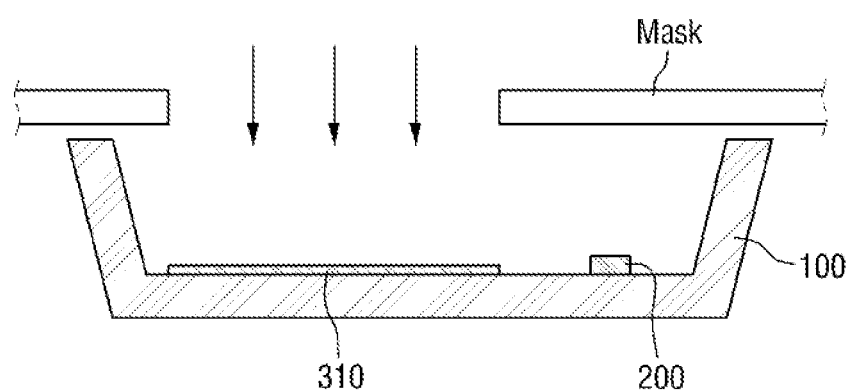

Referring to FIG. 6, a first barrier layer 310 is formed on the surface of the package mold 100 and separated from the LED chip 200. The first barrier layer 310 may be formed on a desired portion of the package mold 100 using a mask. In an exemplary embodiment, the first barrier layer 310 may be formed in a vacuum using a thin-film deposition method such as chemical vapor deposition (CVD), sputtering, or pulsed laser deposition (PLD).

Figure 7:
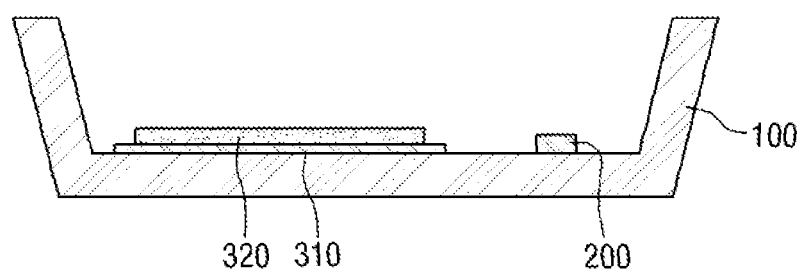

Referring to FIG. 7, a wavelength conversion layer 320 is formed on the first barrier layer 310. In an exemplary embodiment, quantum dots may be dispersed in a dispersing medium so as to become liquid or semi-solid. Then, a predetermined amount of quantum dots may be dispensed onto the first barrier layer 310. A mixture of the dispensed quantum dots and the dispersing medium may then be cured using UV light, thereby forming the wavelength conversion layer 320. In another exemplary embodiment, a pre-cured wavelength conversion material may be cut into a desired size and then fixed onto the first barrier layer 310 using an optical clear adhesive (OCA) or optical clear resin (OCR), thereby forming the wavelength conversion layer 320.

Figure 8:
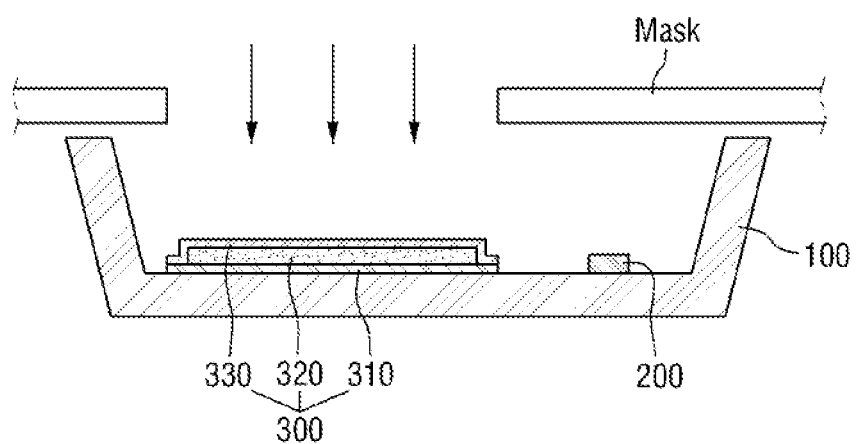

Referring to FIG. 8, a second barrier layer 330 is formed on the wavelength conversion layer 320. The second barrier layer 330 may be formed in substantially the same manner as the first barrier layer 310.

Figure 9:
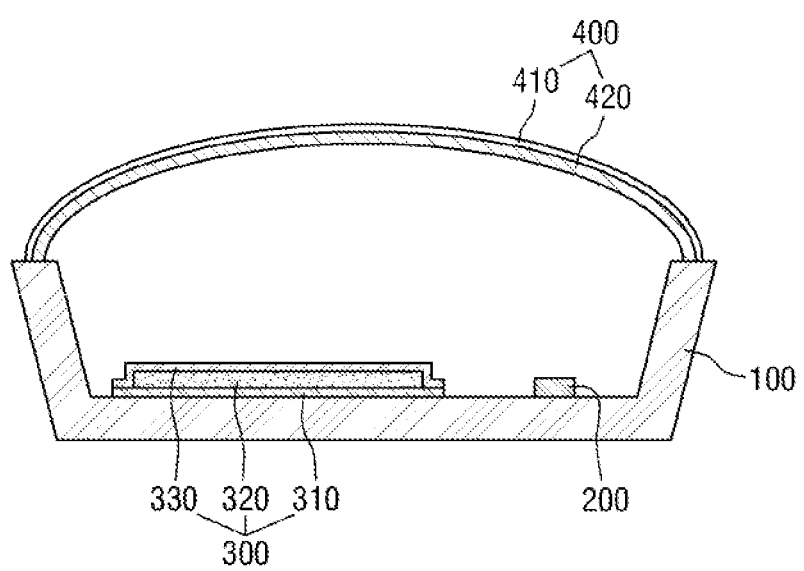

Referring to FIG. 9, a cover 400 is formed in a separate process and then placed on the package mold 100. In an exemplary embodiment, the process of forming the cover 400 may include depositing materials for forming an optical coating layer 420 on a transparent base member 410 in a vacuum condition, using a thin-film deposition method such as CVD, sputtering, or PLD. In another exemplary embodiment, after the optical coating layer 420 is formed on a mother substrate, the mother substrate may be cut into desired sizes to form the cover 400. After the formation of the cover 400, the edges of the cover 400 may be coupled to the ends of the sidewall portions of the package mold 100. In the other exemplary embodiment, although not illustrated in the drawing, an adhesive may be interposed between the edges of the cover 400 and the sidewall portions of the package mold 100.

Figure 10:
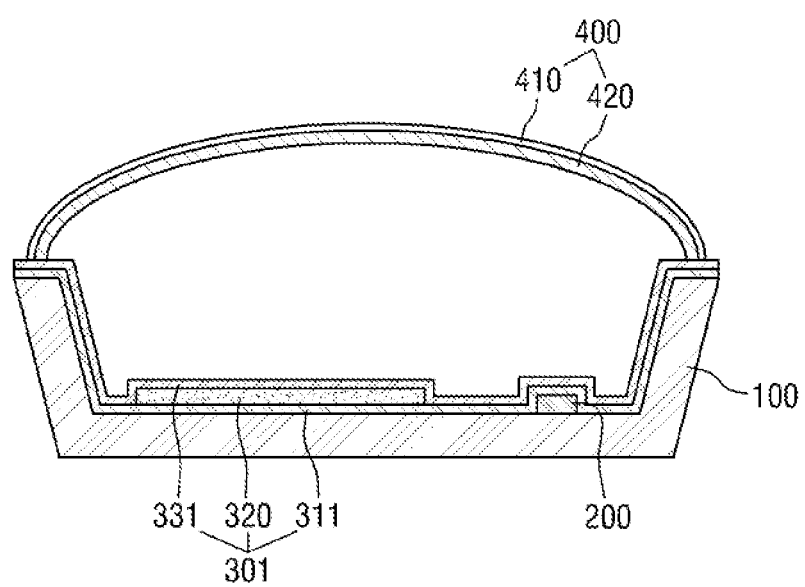
FIG. 10 is a cross-sectional view of an LED package according to another embodiment of the inventive concept.

FIG. 10 is a cross-sectional view of an LED package according to another embodiment of the inventive concept. In the interest of clarity, elements substantially similar to those illustrated in the above-described drawings are indicated by like reference numerals, and thus a description of those similar elements will be omitted.

Referring to FIG. 10, at least one of a first barrier layer 311 and a second barrier layer 331 of a wavelength converter 301 may cover an LED chip 200. In the exemplary embodiment of FIG. 10, both the first barrier layer 311 and the second barrier layer 331 may cover the LED chip 200.

However, the inventive concept is not limited thereto. In some other embodiments, only the first barrier layer 311 or the second barrier layer 331 may cover the LED chip 200. In the exemplary embodiment of FIG. 10, both the first barrier layer 311 and the second barrier layer 331 are located on the LED chip 200. However, the inventive concept is not limited thereto. In some other embodiments, a wavelength conversion layer 320 may be interposed between the first barrier layer 311 and the second barrier layer 331 in the LED chip 200. In those other embodiments, the structure can be realized by forming the first barrier layer 311 and/or the second barrier layer 331 without using a mask. The first barrier layer 311 and/or the second barrier layer 331 formed on the whole surface of a package mold 100 can protect not only the wavelength conversion layer 320 but also the LED chip 200 from the external environment.

Figure 11:
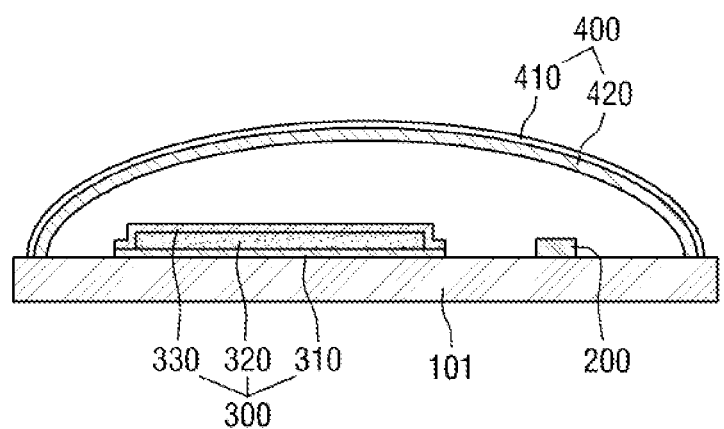
FIGS. 11 through 13 are cross-sectional views of different LED packages according to other embodiments of the inventive concept.
Figure 12:
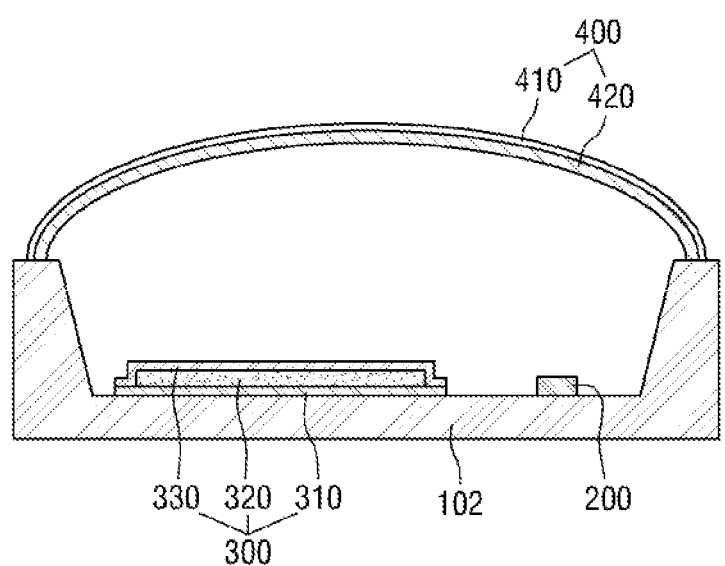

FIGS. 11 and 12 are cross-sectional views of different LED packages according to other embodiments of the inventive concept. In the interest of clarity, elements substantially similar to those illustrated in the above-described drawings are indicated by like reference numerals, and thus a description of those similar elements will be omitted.

Referring to FIGS. 11 and 12, package molds 101 and 102 may be formed having various shapes. Referring to FIG. 11, the package mold 101 may be shaped like a rectangular parallelepiped plate. That is, the sidewall portions previously described may be omitted in the structure of FIG. 11. Referring to FIG. 12, the sidewall portions of the package mold 102 may have a different shape from those of the previous-described embodiments. For example, with reference to FIG. 12, an inner surface of a bottom portion of the package mold 102 and an inner surface of each of the sidewall portions of the package mold 102 may form an obtuse angle, but an outer surface of the bottom portion of the package mold 102 and an outer surface of each of the sidewall portions of the package mold 102 may form a right angle.

Figure 13:
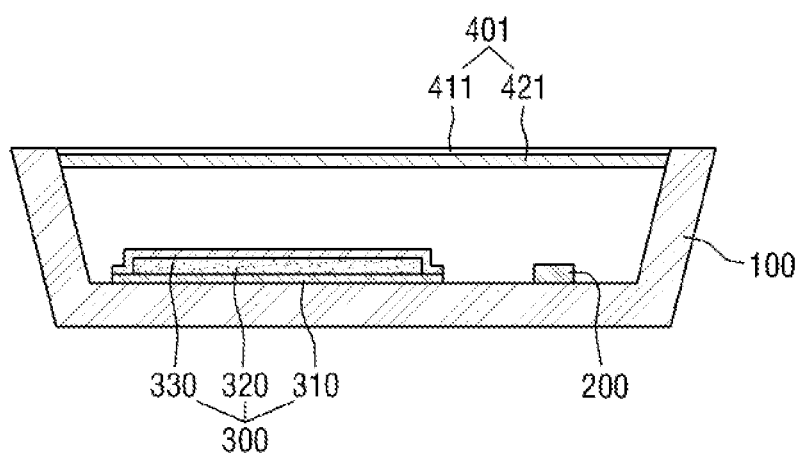

FIG. 13 is a cross-sectional view of an LED package according to another embodiment of the inventive concept. In the interest of clarity, elements substantially similar to those illustrated in the above-described drawings are indicated by like reference numerals, and thus a description of those similar elements will be omitted.

Referring to FIG. 13, a cover 401 may have a flat structure. Specifically, the cover 401 may include a transparent base member 411 having a flat organic substrate and an optical coating layer 421 formed on the transparent base member 411. In the embodiment of FIG. 13, the cover 401 may be coupled to the inner surfaces of the ends of sidewall portions of a package mold 100. Accordingly, the cover 401 may be fixed in position over an LED chip 200 and a wavelength converter 300. In this case, since the cover 401 is not curved, it may be relatively easy to form the cover 401.

Figure 14:
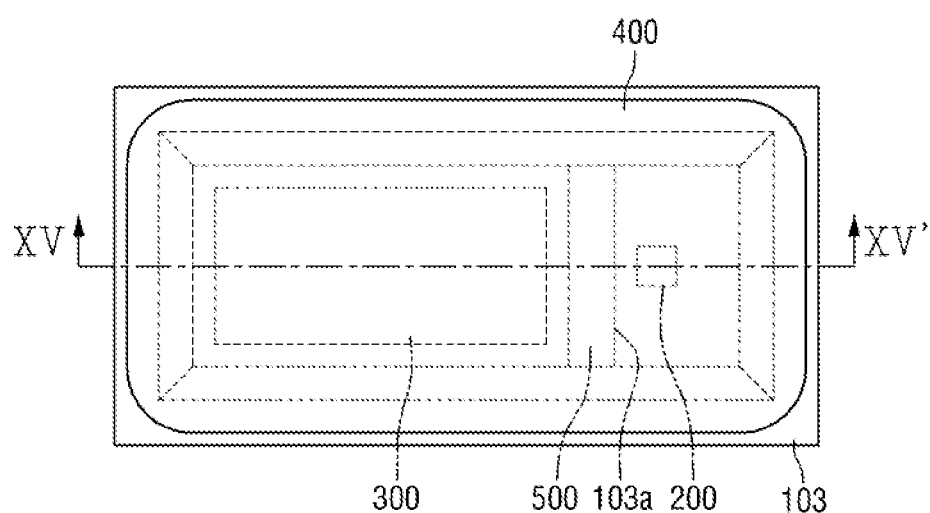
FIG. 14 is a plan view of an LED package according to another embodiment of the inventive concept.
Figure 15:
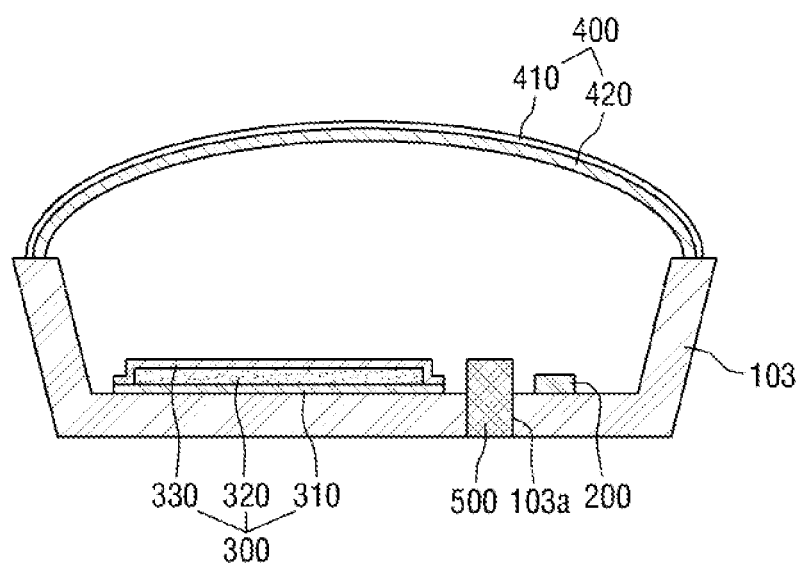
FIG. 15 is a cross-sectional view taken along line XV-XV' of FIG. 14.

FIG. 14 is a plan view of an LED package according to another embodiment of the inventive concept. FIG. 15 is a cross-sectional view taken along line XV-XV' of FIG. 14. In the interest of clarity, elements substantially similar to those illustrated in the above-described drawings are indicated by like reference numerals, and thus a description of those similar elements will be omitted.

Referring to FIGS. 14 and 15, the LED package may farther include a heat-blocking member 500. The heat-blocking member 500 may be interposed between an LED chip 200 and a wavelength converter 300. Specifically, the heat-blocking member 500 may be inserted into an insertion hole 103*a* of a package mold 103. In this case, to prevent the heat-blocking member 500 from blocking the path of light emitted from the LED chip 200, a distance from a surface of the package mold 103 to an upper surface of the heat-blocking member 500 may be smaller than or equal to a thickness of the wavelength converter 300.

The heat-blocking member 500 may prevent heat generated from the LED chip 200 from being transferred to the wavelength converter 300 via a bottom portion of the package mold 103. As such, the heat-blocking member 500 can help to prevent degradation of a wavelength conversion layer 320 caused by heat generated from the LED chip 200.

The heat-blocking member 500 may be made from generally known heat-blocking materials. In addition, the heat-blocking member 500 may include a plurality of cavities disposed therein, and the cavities may be filled with an inert gas.

Figure 16:
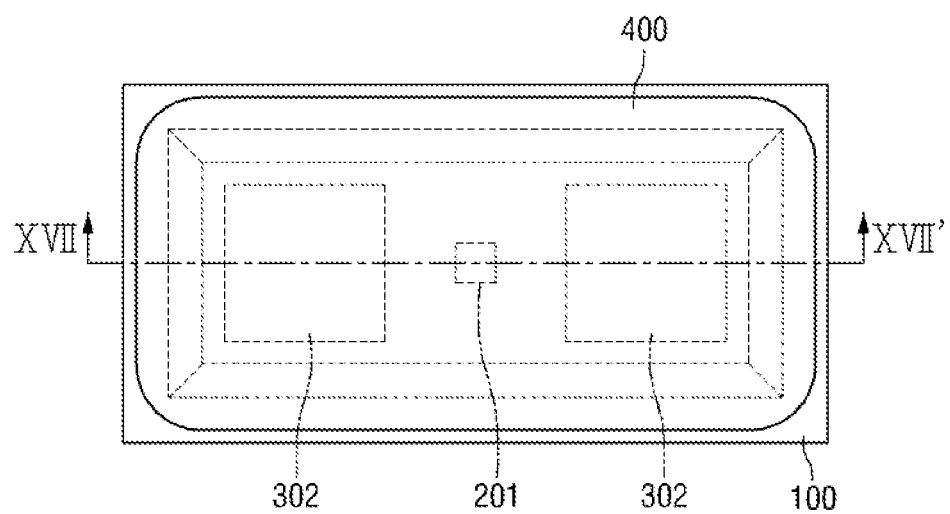
FIG. 16 is a plan view of an LED package according to another embodiment of the inventive concept.
Figure 17:
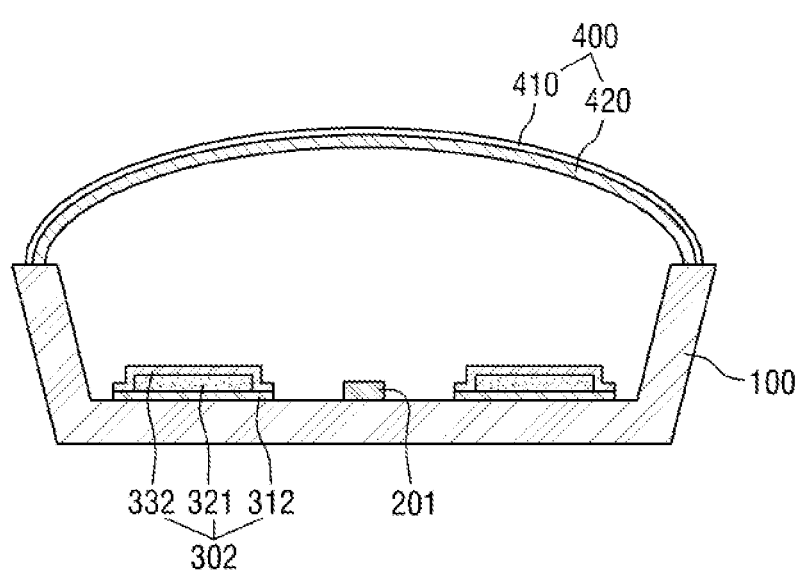
FIG. 17 is a cross-sectional view taken along line XVII-XVII' of FIG. 16.

FIG. 16 is a plan view of an LED package according to another embodiment of the inventive concept. FIG. 17 is a cross-sectional view taken along line XVII-XVII' of FIG. 16. In the interest of clarity, elements substantially similar to those illustrated in the above-described drawings are indicated by like reference numerals, and thus a description of those similar elements will be omitted.

Referring to FIGS. 16 and 17, an LED chip 201 may be formed on a central portion of a surface of a package mold 100. In addition, a wavelength converter 302 may be provided in plural and the wavelength converters 302 may surround the LED chip 201. In the exemplary embodiment of FIGS. 16 and 17, a plurality of first barrier layers 312, a plurality of wavelength conversion layers 321, and a plurality of second barrier layers 332 may collectively constitute a plurality of wavelength converters 302, and the wavelength converters 302 may be disposed adjacent to both sides of the LED chip 201.

Figure 18:
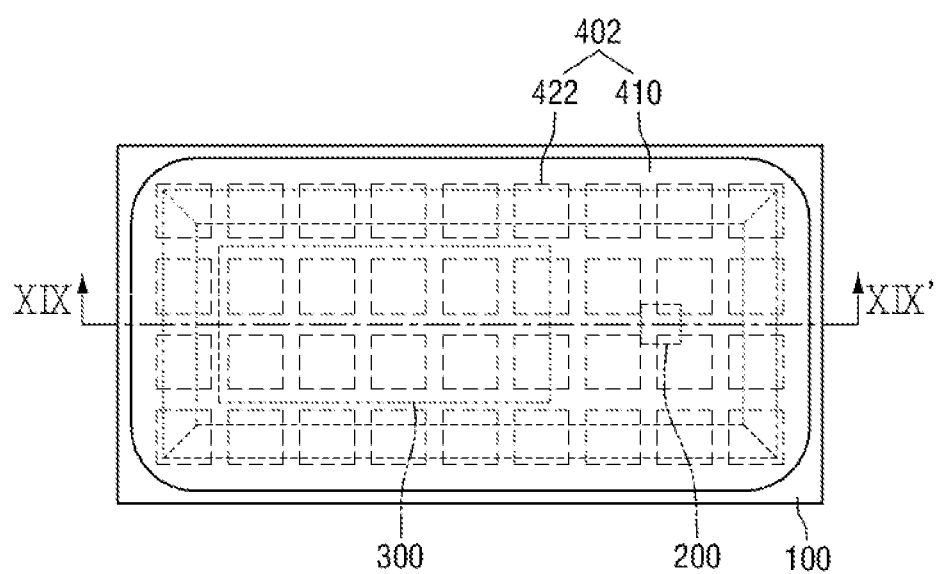
FIG. 18 is a plan view of an LED package according to another embodiment of the inventive concept.
Figure 19:
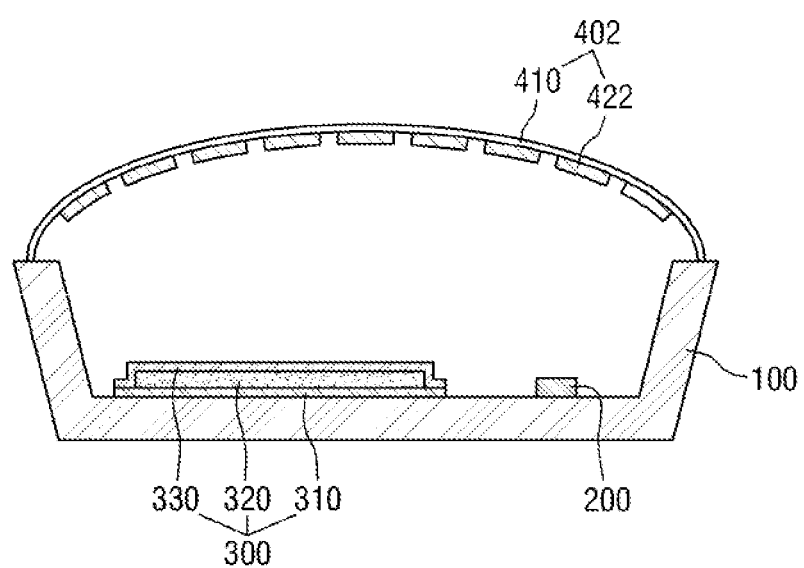
FIG. 19 is a cross-sectional view taken along line XIX-XIX' of FIG. 18.

FIG. 18 is a plan view of an LED package according to another embodiment of the inventive concept. FIG. 19 is a cross-sectional view taken along line XIX-XIX' of FIG. 18. In the interest of clarity, elements substantially similar to those illustrated in the above-described drawings are indicated by like reference numerals, and thus a description of those similar elements will be omitted.

Referring to FIGS. 18 and 19, an optical coating layer 422 of a cover 402 may be patterned. That is, the optical coating layer 422 may include a plurality of optical patterns separated from each other. In an exemplary embodiment, the optical patterns may be arranged in a matrix, but the inventive concept is not limited thereto. Patterning the optical coating layer 422 may increase the proportion of blue light in the light that is output to the outside. That is, blue light emitted from an LED chip 200 is reflected to the inside at portions of the cover 402 where the optical coating layer 422 is formed, but output to the outside without reflecting at portions of the cover 402 where the optical coating layer 422 is not formed. By patterning the optical coating layer 422, a mixture ratio of blue light and yellow light output to the outside can be adjusted.

Embodiments of the inventive concept provide at least one of the following advantages.

That is, a thin LED package which emits high-purity white light can be obtained.

In addition, quantum dots can be maintained in a stable manner within an LED package.

However, the advantages of the inventive concept are not limited to those described above. The above and other advantages of the inventive concept will be more apparent to one of ordinary skill in the art with reference to the claims.

While the inventive concept has been shown and described with reference to exemplary embodiments, it will be understood by those of ordinary skill in the art that various changes in form and details may be made therein without departing from the spirit and scope of the present disclosure.

What is claimed is:

1. A light-emitting diode (LED) package comprising:
a package mold;
an LED chip disposed on a surface of the package mold; and
a wavelength converter disposed on the surface of the package mold; and
a heat-blocking member interposed between the LED chip and the wavelength converter, wherein the heat-blocking member does not overlap the LED chip in a plan view,
wherein the wavelength converter comprises:
a first barrier layer disposed on the surface of the package mold so as to directly contact with surface of the package mold;
a wavelength conversion layer disposed on the first barrier layer; and
a second barrier layer disposed on the wavelength conversion layer, and
wherein the first barrier layer includes an insulating material.

2. The LED package of claim 1, wherein the wavelength conversion layer comprises quantum dots.

3. The LED package of claim 1, wherein the LED chip and the wavelength converter lie in a same plane.

4. The LED package of claim 1, further comprising a cover disposed on the surface of the package mold and covering the LED chip and the wavelength converter, wherein the cover comprises a transparent base member and an optical coating layer that reflects most of light in a specific wavelength region.

5. The LED package of claim 4, wherein the optical coating layer passes most of light in a wavelength region excluding the specific wavelength region.

6. The LED package of claim 4, wherein the specific wavelength region is a wavelength region of blue light.

7. The LED package of claim 4, wherein the optical coating layer comprises a plurality of optical patterns separated from each other.

8. The LED package of claim 1, wherein the second barrier layer comprises an insulating material.

9. The LED package of claim 8, wherein the insulating material comprises at least one of silicon oxide and silicon nitride.

10. The LED package of claim 1, wherein the LED chip emits blue light, and the wavelength converter converts the blue light into yellow light.

11. The LED package of claim 1, wherein the LED chip and the wavelength converter are separated by a distance of less than approximately 30 mm.

12. The LED package of claim 1, wherein an area of the wavelength conversion layer is approximately 10 to 200 times an area of the LED chip.

13. The LED package of claim 1, wherein at least one of the first barrier layer and the second barrier layer covers the LED chip.

14. An LED package comprising:
a package mold;
an LED chip disposed on a surface of the package mold;
a wavelength converter disposed on the surface of the package mold;
a heat-blocking member interposed between the LED chip and the wavelength converter, wherein the heat-blocking member does not overlap the LED chip in a plan view; and
a cover disposed on the surface of the package mold and covering the LED chip and the wavelength converter,
wherein the cover comprises:
a transparent base member; and
an optical coating layer disposed on the transparent base member, wherein the optical coating layer reflects most of light in a specific wavelength region,
wherein the wavelength converter comprises:
a first barrier layer disposed on the surface of the package mold so as to directly contact with surface of the package mold;
a wavelength conversion layer disposed on the first barrier layer; and
a second barrier layer disposed on the wavelength conversion layer, and
wherein the first barrier layer includes an insulating material.

15. The LED package of claim 14, wherein the wavelength converter comprises:
a first barrier layer disposed on the surface of the package mold;
a wavelength conversion layer disposed on the first barrier layer; and
a second barrier layer disposed on the wavelength conversion layer.

16. The LED package of claim 15, wherein the wavelength conversion layer comprises quantum dots.

17. A method of manufacturing an LED package, the method comprising:
forming an LED chip on a surface of a package mold;
forming a wavelength converter on the surface of the package mold; and
forming a heat-blocking member interposed between the LED chip and the wavelength converter, wherein the heat-blocking member does not overlap the LED chip in a plan view,
wherein forming the wavelength converter comprises:
forming a first barrier layer on the surface of the package mold so as to directly contact with surface of the package mold;
forming a wavelength conversion layer on the first barrier layer; and
forming a second barrier layer on the wavelength conversion layer, and wherein the first barrier layer includes an insulating material.

18. The method of claim 17, further comprising:
forming a cover on the surface of the package mold after forming the wavelength converter, the cover covering the LED chip and the wavelength converter.

19. The method of claim 18, wherein forming the cover comprises:
preparing a transparent base member; and
forming an optical coating layer on the transparent base member, wherein the optical coating layer reflects most of light in a specific wavelength region.

* * * * *